US012777662B2

(12) United States Patent
Boufnichel

(10) Patent No.: US 12,777,662 B2
(45) Date of Patent: Oct. 27, 2026

(54) METHOD OF FABRICATING A CAPACITOR

(71) Applicant: STMICROELECTRONICS (TOURS) SAS, Tours (FR)

(72) Inventor: Mohamed Boufnichel, Monnaie (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 488 days.

(21) Appl. No.: 18/357,898

(22) Filed: Jul. 24, 2023

(65) Prior Publication Data

US 2024/0128311 A1 Apr. 18, 2024

(30) Foreign Application Priority Data

Oct. 14, 2022 (FR) ........................................ 2210596

(51) Int. Cl.

| | |
|---|---|
| ***H10D 1/00*** | (2025.01) |
| ***H10D 1/68*** | (2025.01) |
| ***H10P 14/694*** | (2026.01) |
| ***H10P 50/00*** | (2026.01) |
| ***H10P 50/26*** | (2026.01) |
| ***H10P 50/28*** | (2026.01) |

(52) U.S. Cl.
CPC ............. *H10D 1/042* (2025.01); *H10D 1/043* (2025.01); *H10D 1/716* (2025.01); *H10P 14/69433* (2026.01); *H10P 50/267* (2026.01); *H10P 50/283* (2026.01); *H10P 50/71* (2026.01); *H10P 50/73* (2026.01)

(58) Field of Classification Search
CPC ........ H10D 1/042; H10D 1/716; H10D 1/043; H10P 50/71; H10P 50/73; H10P 14/69433; H10P 50/267; H10P 50/283
See application file for complete search history.

(56) References Cited

U.S. PATENT DOCUMENTS

| | | | | |
|---|---|---|---|---|
| 2003/0129771 | A1 | 7/2003 | Summerfelt et al. | |
| 2011/0108951 | A1 | 5/2011 | Cho et al. | |
| 2020/0006470 | A1 | 1/2020 | Chang et al. | |
| 2023/0326890 | A1 * | 10/2023 | Chang .................... | H10W 90/00 |

FOREIGN PATENT DOCUMENTS

| | | | |
|---|---|---|---|
| JP | 2010153855 | A | 7/2010 |
| KR | 20060114056 | A | 11/2006 |
| KR | 100866683 | B1 | 11/2008 |

* cited by examiner

*Primary Examiner* — Mohammad M Choudhry
(74) *Attorney, Agent, or Firm* — Seed Intellectual Property Law Group LLP

(57) ABSTRACT

The present disclosure relates to a capacitor including a first conductive layer over which is formed a stack, comprising from the upper face of the first layer, a first electrode, a first dielectric layer, a second electrode, and a second conductive layer, the stack comprising a stair step within the second conductive layer, the second electrode, and a part of the thickness of the first dielectric layer, the stair step being filled with a second dielectric layer so that the sidewalls of the first electrode are aligned with respect to the sidewalls of the second dielectric layer.

20 Claims, 2 Drawing Sheets

METHOD OF FABRICATING A CAPACITOR

CROSS-REFERENCE TO RELATED APPLICATION(S)

This application claims the priority benefit of French patent application number 2210596, filed on Oct. 14, 2022, entitled "Procédé de fabrication d'un condensateur" which is hereby incorporated by reference to the maximum extent allowable by law.

BACKGROUND

Technical Field

The present disclosure generally relates to fabricating an integrated circuit and more particularly relates to fabricating an integrated circuit including a capacitor, for example a RC filter (including a resistor and a capacitor), a LC filter (including an inductor and a capacitor), or a RLC filter (including a resistor, an inductor, and a capacitor).

Description of the Related Art

Numerous methods of fabricating integrated circuits including capacitors have been provided. These methods have various drawbacks. There is thus a need to improve the methods of fabricating an integrated circuit comprising a capacitor to address all or some of the drawbacks of known methods.

BRIEF SUMMARY

One embodiment provides a method of fabricating a capacitor, comprising the following successive steps:

a) forming a stack including a bottom face and an upper face, the stack comprising in the order from its bottom face, a first conductive layer, a first electrode, a first dielectric layer, a second electrode, and a second conductive layer;

b) etching away by localized etching, from the upper face of the stack, the second conductive layer, the second electrode, and a part of the thickness of the first dielectric layer within a peripheral part of the stack;

c) forming a second dielectric layer over the whole surface of the stack, on the side of the upper face of the stack; and d) etching away the second dielectric layer, the first dielectric layer, and the first electrode, by a non-localized vertical anisotropic etching, until exposing the upper face of the second conductive layer in a middle part, being not etched in step b), of the stack, and the upper face of the first conductive layer within the peripheral part of the stack.

According to an embodiment, at the end of step d), a part of the second dielectric layer remains on the sidewall of the middle part of the stack.

According to an embodiment, the etching in step b) is a chemical plasma etching.

According to an embodiment, the plasma of the etching in step b) is a chlorine-based plasma.

According to an embodiment, the etching in step d) is performed whole wafer.

According to an embodiment, wherein the etching in step d) is a chemical plasma etching.

According to an embodiment, the plasma of the etching in step d) is a fluorine-based plasma.

According to an embodiment, during step c), the second dielectric layer is conformally formed.

According to an embodiment, the method comprises between the steps a) and b), a step of forming an etching mask.

According to an embodiment, the first and second conductive layers are aluminum-based layers.

According to an embodiment, the first and second dielectric layers are made of the same material.

According to an embodiment, the first and second dielectric layers are made of silicon nitride.

According to an embodiment, the first and second electrodes are made of tantalum nitride.

Another embodiment provides a capacitor including a first conductive layer over which is formed a stack comprising from the upper face of the first layer, a first electrode, a first dielectric layer, a second electrode, and a second conductive layer, the stack comprising a stair step within the second conductive layer, the second electrode, and within a part of the thickness of the first dielectric layer, the stair step being filled with a second dielectric layer so that the sidewalls of the first electrode are aligned with respect to the sidewalls of the second dielectric layer.

According to an embodiment, the capacitor is formed according to the method described above.

BRIEF DESCRIPTION OF THE SEVERAL VIEWS OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, the operations and elements that are useful for an understanding of the embodiments described herein have been illustrated and described in detail. In particular, we herein mainly consider fabricating a part of an integrated circuit constituting the capacitor. The other steps of the method of fabricating the integrated circuit are in the capacities of those skilled in the art and will not be hereinafter described.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms “front,” “back,” “top,” “bottom,” “left,” “right,” etc., or to relative positional qualifiers, such as the terms “above,” “below,” “higher,” “lower,” etc., or to qualifiers of orientation, such as “horizontal,” “vertical,” etc., reference is made to the orientation shown in the figures.

Unless specified otherwise, the expressions “around,” “approximately,” “substantially” and “in the order of” signify within 10%, and preferably within 5%.

FIGS. 1 to 5 are cross-sectional views illustrating successive steps of an example method of forming a capacitor according to an embodiment.

Figure 1:
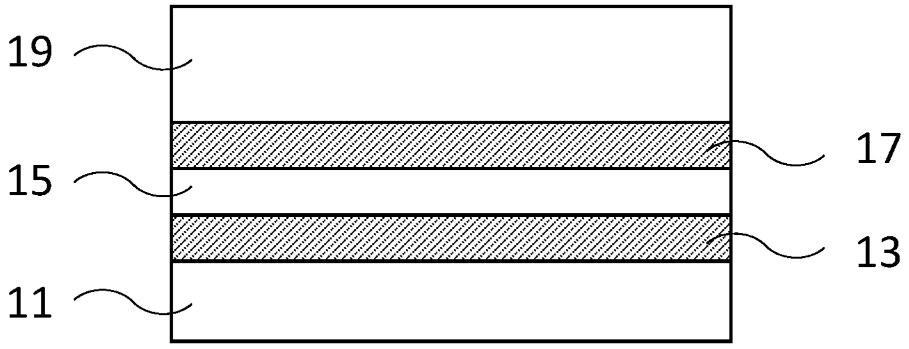
FIG. 1 is a cross-sectional view illustrating a step of a method of fabricating a capacitor according to an embodiment.

FIG. 1 illustrates a starting stack successively comprising from a bottom face of the stack, a first conductive layer 11, a first electrode 13, a first dielectric layer 15, a second electrode 17, and a second conductive layer 19.

As an example, the stack is supported by a non-represented support. The support for example allows supporting other elements, such as inductors, or resistors formed nearby the capacitor. The support is for example a substrate made of glass or silicon, preferably highly resistive. The support is for example spaced from the conductive layer 11 by a dielectric layer, for example an oxide layer, for example of undoped silicon glass or any other silicon oxide.

The first conductive layer 11, also called redistribution layer or RDL is for example made of a metal material. As an example, the conductive layer 11 is made of aluminum or of an aluminum-based alloy. The conductive layer 11 is for example made of an aluminum (Al) or Aluminum copper alloy (AlCu), or of an aluminum, copper, and silicon alloy (AlSiCu). As an example, the conductive layer 11 has a thickness comprised between 0.5 μm and 3 μm, for example in the order of 1.5 μm.

The first electrode 13 is for example located on and contacts the conductive layer 11. The electrodes 13 and 17 can be made of the same material or of different materials. The electrodes 13 and 17 can for example be made of tantalum nitride (TaN). Alternatively, the electrodes 13 and 17 can be made of polysilicon or of platinum. As an example the electrode 13 has a thickness comprised between 20 nm and 200 nm, preferably in the order of about 80 nm. As an example the electrode 17 has a thickness comprised between 20 nm and 200 nm, preferably in the order of about 80 nm.

The electrodes 13 and 17, also called bottom or top electrodes respectively, are separated by the dielectric layer 15. As an example, the dielectric layer 15 is located on and contacts the electrode 13 and the electrode 17 is located on and contacts the dielectric layer 15. The layer 15 is made of a dielectric material. As an example, the dielectric layer 15 is made of silicon nitride ($Si_3N_4$) or of tantalum oxynitride (TaON). The dielectric layer 15 has for example a thickness comprised between 20 nm and 600 nm, for example in the order of 100 nm, in the order of 175 nm, or in the order of 400 nm.

The electrode 17 is coated with the conductive layer 19. As an example, the conductive layer 19 is located on and contacts the electrode 17. As an example, the conductive layer 19 is made of a metal material. More precisely, the conductive layer 19 is made of a metal material etchable by plasma. As an example, the conductive layer 19 is made of aluminum, copper, platinum, tungsten, titanium, or of an alloy based on one of these materials such as a copper-titanium alloy (TiCu), a copper-aluminum alloy (AlCu), or a titanium-tungsten alloy (TiW). As an example, the layer 19 has for example a thickness comprised between 20 nm and 600 nm, for example in the order of 400 nm.

In the stack represented in FIG. 1, the layers and electrodes 13, 15, 17, and 19 are vertically aligned. In particular, they extend each over the whole top surface of the conductive layer 11.

Figure 2:
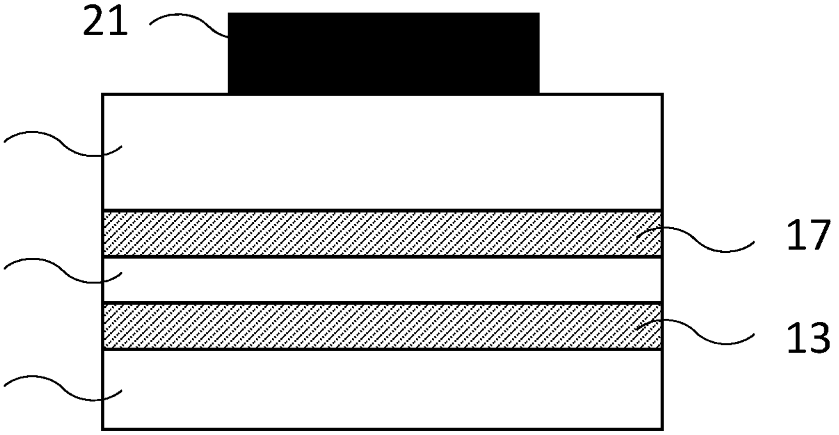
FIG. 2 is a cross-sectional view illustrating another step of a method of fabricating a capacitor according to an embodiment.

FIG. 2 illustrates a structure obtained at the end of the step of depositing a masking layer 21 on the front face of the stack represented in FIG. 1.

During this step, one comes depositing the masking layer 21, for example by centrifugation, on the upper face of the structure, i.e., the front face of the stack in the orientation of FIG. 2. More precisely, one comes depositing the masking layer 21 on and in contact with the upper face of the conductive layer 19.

At the end of the step of depositing the masking layer 21, the latter is locally removed, for example by photolithography. As an example, the masking layer 21 is locally removed so that it remains opposite to a middle part of the stack, and more particularly opposite to a part of the stack where the capacitor will be formed. The middle part of the stack is, for example, surrounded or encircled by the peripheral part of the stack.

The masking layer 21 is for example a photosensitive resin.

Figure 3:
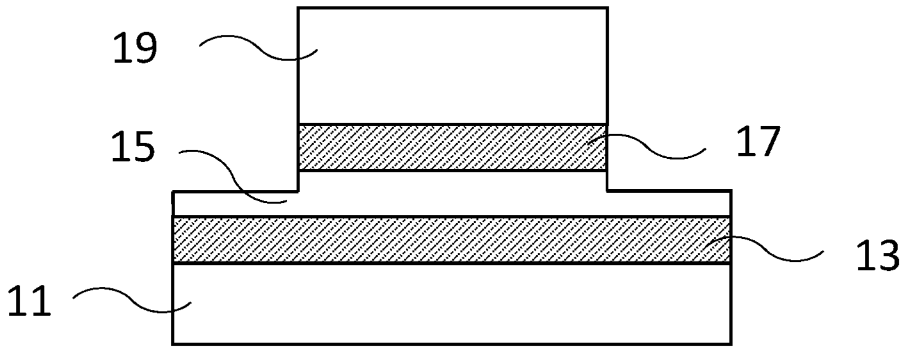
FIG. 3 is a cross-sectional view illustrating another step of a method of fabricating a capacitor according to an embodiment.

FIG. 3 illustrates a structure obtained at the end of a step of etching a top part of the structure represented in FIG. 2. As an example, the etching corresponds to a chemical plasma etching, for example by means of a fluorine and/or chlorine-based plasma using the masking layer 21 as an etching mask.

As an example, during this step, the conductive layer 19, the electrode 17, and a part of the thickness of the dielectric layer 15 are removed in a peripheral part of the stack, i.e., out of opposite to the masking layer 21. In other words, during this step, one comes entirely remove the parts of the conductive layer 19 and the electrode 17 not coated with the masking layer 21 and a part of the thickness of the dielectric layer 15 in its part not coated with the masking layer 21. Yet in other words, during this step, are created stair steps, leading into the dielectric layer 15, out of opposite to the masking layer 21.

As an example, at the end of this step, around 50% of the thickness of the dielectric layer 15 remains out of opposite to the masking layer 21. As an example, at the end of this step, around 20 nm of the dielectric layer 15 remains out of opposite to the masking layer 21.

As an example, the masking layer 21 is removed at the end of the step of etching the semiconductor layer 19, the electrode 17, and the dielectric layer 15.

Figure 4:
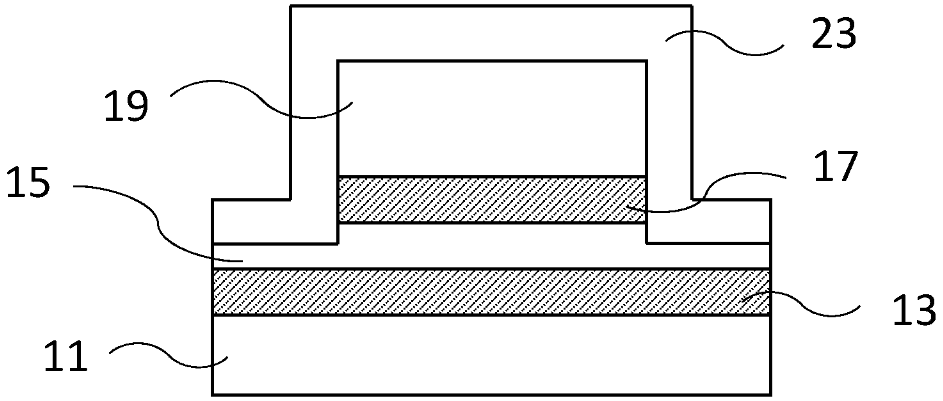
FIG. 4 is a cross-sectional view illustrating another step of a method of fabricating a capacitor according to an embodiment.

FIG. 4 illustrates a structure obtained at the end of a step of depositing a second dielectric layer 23 on the upper face of the structure represented in FIG. 3.

During this step, the layer 23 is more precisely deposited on the upper face of the layer 19, on the sidewalls of the layer 19, on the sidewalls of the electrode 17, on the part of the upper face of the layer 15 not coated with the layer 17 and on the sidewalls of the layer 15.

As an example, the layer 23 is conformally deposited, i.e., it is deposited on the whole upper face of the structure with an even thickness. As an example, the thickness of the layer 23 is comprised between 20 nm and 200 nm, for example in the order of 100 nm. The dielectric layers 15 and 23 are for example made of the same material. Alternatively, the dielectric layers 15 and 23 are made of different materials. The layer 23 is made of a dielectric material, for example of a nitride, or of an oxide. As an example, the layer 23 is made of tetraethylorthosilicate, or TEOS, of silicon nitride, or of tantalum oxynitride.

As an example, the dielectric layers 15 and 23 are made of the same material and are formed with the same thickness.

Figure 5:
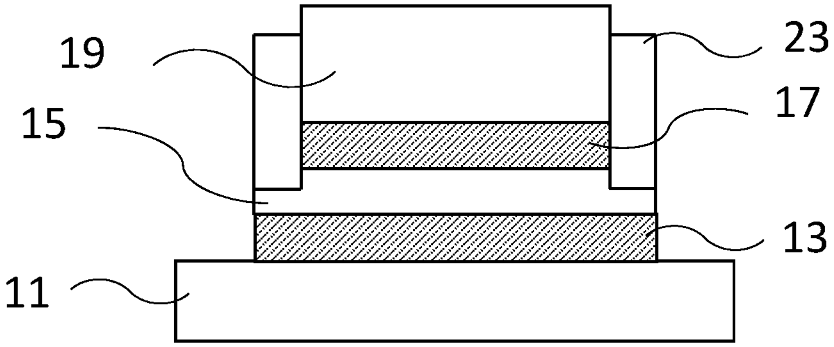
FIG. 5 is a cross-sectional view illustrating another step of a method of fabricating a capacitor according to an embodiment.

FIG. 5 illustrates a structure obtained at the end of the step of etching the structure represented in FIG. 4.

During this step, the structure represented in FIG. 4 is etched away, from its upper face, whole wafer, i.e., over its entire surface.

The etching of this step corresponds to a vertical anisotropic chemical plasma etching. In other words, the etching is directional, it mainly operates in a single preferential direction, herein the vertical direction in the orientation of the figure.

As an example, the etching is performed by means of a fluorine-based plasma. As an example, this etching step is selective and allows a part of the dielectric layer 23, a part of the electrode 13, a part of the dielectric layer 15, to be removed but has no, or very little, effect on the conductive layer 19 that remains.

The etching step is for example stopped as the upper face of the conductive layer 11 is uncovered within the peripheral part of the stack. The layers 23, and 15, and the electrode 13 are thus successively removed.

Thus, during this step, the dielectric layer 23 is removed within the middle part of the stack, i.e., opposite to the conductive layer 19. Always during this step, the electrode 13 and the dielectric layers 15 and 23 are thus removed within the peripheral part of the stack. Still during this step, between the middle part and the peripheral part, a part of the dielectric layer 23 located on the sidewalls of the conductive layer 19 is removed.

At the end of the etching step, the upper face of the conductive layer 19 and the upper face of the dielectric layer 23 are not aligned, the upper face of the layer 23 being recessed compared to the upper face of the layer 19. This recess is due to the fact that there is more removable material, by plasma etching, in the peripheral part of the stack than in the middle part of the stack. Indeed, when the dielectric layer 23 was removed within a thickness corresponding to the thickness located in the middle part of the stack, the etching goes on, the dielectric layer 23 formed on the sidewalls of the conductive layer 19 is then removed. As an example, at the end of this step, the level difference between the upper face of the layer 19 and the upper face of the layer 23 is in the order of 40 nm.

At the end of the etching step, the structure comprises a middle part successively comprising, on the upper face of the conductive layer 11, the electrode 13, the dielectric layer 15, the electrode 17, and the conductive layer 29. In this structure, the electrode 13 and a part of the layer 15 extend beyond the sidewalls of the layer 19 and are coated with the layer 23 formed on a part of the sidewalls of the layers 19 and 15 and of the electrode 17, so that the sidewalls of the electrode 13 and of the layer 15 are aligned with the sidewalls of the layer 23. For example, the sidewalls of the electrode 13, the layer 15, and the layer 23 are coplanar with each other.

One should note that according to the used materials, the rate of etching of the electrode 13 could be slightly higher than that of the layers 15 and 23. In this case, the etching step may create a light recess (not illustrated) of the sidewall of the electrode 13 compared to the sidewall of the layers 15 and 23.

At the end of this step, a metal pad, not illustrated, for example made of copper, is, for example, located on the upper face of the conductive layer 19.

One advantage of the present embodiment is that it allows a capacitor to be formed at a limited cost since the method comprises a single photolithography step.

Another advantage of the present embodiment is it allows the gap between the sidewall of the conductive layer 19 and the sidewall of the electrode 13 to be reduced, thanks to the protection conferred by the dielectric layer 23 on the sidewalls of the layers 15 and 19.

Various embodiments and variants have been described. Those skilled in the art will understand that certain features of these embodiments can be combined and other variants will readily occur to those skilled in the art. In particular, the embodiments are not limited to the example numeral values, nor to the example materials recited in the present disclosure.

Finally, the practical implementation of the embodiments and variants described herein is within the capabilities of those skilled in the art based on the functional description provided hereinabove.

A method of fabricating a capacitor, may be summarized as including the following successive steps: a) forming a stack including a bottom face and an upper face, the stack including in the order from its bottom face, a first conductive layer (11), a first electrode (13), a first dielectric layer (15), a second electrode (17), and a second conductive layer (19); b) etching away by localized etching, from the upper face of the stack, the second conductive layer (19), the second electrode (17), and a part of the thickness of the first dielectric layer (15) within a peripheral part of the stack; c) forming a second dielectric layer (23) over the whole surface of the stack, on the side of the upper face of the stack; and d) etching away the second dielectric layer (23), the first dielectric layer (15), and the first electrode (13), by non-localized vertical anisotropic etching, until exposing the upper face of the second conductive layer (19) in a middle part, being not etched in step b), of the stack, and the upper face of the first conductive layer (11) within the peripheral part of the stack.

At the end of step d), a part of the second dielectric layer (23) may remain on the sidewall of the middle part of the stack.

The etching in step b) may be a chemical plasma etching.

The plasma of the etching in step b) may be a chlorine-based plasma.

The etching in step d) may be performed whole wafer.

The etching in step d) may be a chemical plasma etching.

The plasma of the etching in step d) may be a fluorine-based plasma.

During step c), the second dielectric layer (23) may be conformally formed.

The method may include between the steps a) and b), a step of forming an etching mask (21).

The first (11) and second (19) conductive layers may be aluminum-based layers.

The first (15) and second (23) dielectric layers may be made of the same material.

The first (15) and second (23) dielectric layers may be made of silicon nitride.

The first (13) and second (17) electrodes may be made of tantalum nitride.

A capacitor may be summarized as including a first conductive layer (11) over which is formed a stack, including from the upper face of the first layer (11), a first electrode (13), a first dielectric layer (15), a second electrode (17), and a second conductive layer (19), the stack including a stair step within the second conductive layer (19), the second electrode (17), and a part of the thickness of the first dielectric layer (15), the stair step being filled with a second dielectric layer (23) so that the sidewalls of the first electrode (13) are aligned with respect to the sidewalls of the second dielectric layer (23).

The capacitor may be formed according to the method described above.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of fabricating a capacitor, the method comprising:
- forming a stack including a bottom face and an upper face, the stack including, from the bottom face of the stack, a first conductive layer, a first electrode on the first conductive layer, a first dielectric layer on the first electrode, a second electrode on the first dielectric layer, and a second conductive layer on the second electrode;
- etching away, by localized etching from the upper face of the stack, the second conductive layer, the second electrode, and a part of the first dielectric layer in a peripheral part of the stack;
- forming a second dielectric layer over the whole surface of the stack on the upper face of the stack; and
- etching away, by non-localized vertical anisotropic etching, the second dielectric layer, the first dielectric layer, and the first electrode until exposing an upper face of the second conductive layer in a middle part of the stack and an upper face of the first conductive layer in the peripheral part of the stack.

2. The method according to claim 1, wherein, at the end of the non-localized vertical anisotropic etching, a part of the second dielectric layer remains on a sidewall of the middle part of the stack.

3. The method according to claim 1, wherein the localized etching is a chemical plasma etching.

4. The method according to claim 3, wherein the chemical plasma is a chlorine-based plasma.

5. The method according to claim 1, wherein the non-localized vertical anisotropic etching is performed whole wafer.

6. The method according to claim 1, wherein the non-localized vertical anisotropic etching is a chemical plasma etching.

7. The method according to claim 6, wherein the chemical plasma is a fluorine-based plasma.

8. The method according to claim 1, wherein the forming of the second dielectric layer includes conformally forming the second dielectric layer over the whole surface of the stack on the upper face of the stack.

9. The method according to claim 1, further comprising:
- forming an etching mask on the second conductive layer prior to the localized etching.

10. The method according to claim 1, wherein the first and second conductive layers are aluminum-based layers.

11. The method according to claim 1, wherein the first and second dielectric layers are made of the same material.

12. The method according to claim 1, wherein the first and second dielectric layers are made of silicon nitride.

13. The method according to claim 1, wherein the first and second electrodes are made of tantalum nitride.

14. A method, comprising:
- forming a stack having a peripheral portion and a middle portion, the forming of the stack including:
  - forming a first electrode on a first conductive layer;
  - forming a first dielectric layer on the first electrode;
  - forming a second electrode on the first dielectric layer; and
  - forming a second conductive layer on the second electrode;
- removing, by localized etching, the second conductive layer, the second electrode, and a portion of the first dielectric layer in the peripheral portion of the stack such that a sidewall of the middle portion of the stack is exposed;
- forming a second dielectric layer on the first dielectric layer and on the sidewall of the middle portion of the stack; and
- removing, by non-localized etching, the second dielectric layer, the first dielectric layer, and the first electrode until an upper surface of the second conductive layer and an upper surface of the first conductive layer are exposed.

15. The method of claim 14, wherein an upper surface of the second dielectric layer is recessed compared to the upper surface of the second conductive layer, and sidewalls of the first electrode, the first dielectric layer, and the second dielectric layer are aligned with each other.

16. A method comprising:
- forming a first electrode on a first conductive layer;
- forming a first dielectric layer on the first electrode;
- forming a second electrode on the first dielectric layer;
- forming a second conductive layer on the second electrode;
- forming sidewalls of the second conductive layer, the second electrode, and the first dielectric layer and an upper surface of the first dielectric layer by performing localized etching of the second conductive layer, the second electrode, and the first dielectric layer;
- forming a second dielectric layer on the sidewalls of the second conductive layer, the second electrode, and the first dielectric layer and the upper surface of the first dielectric layer; and
- exposing an upper surface of the second conductive layer and an upper surface of the first conductive layer by performing non-localized etching of the second dielectric layer, the first dielectric layer, and the first electrode.

17. The method of claim 16, wherein forming the non-localized etching includes forming an upper surface of the second dielectric layer that is lower than the upper surface of the second conductive layer.

18. The method of claim 16, wherein the first and second conductive layers include aluminum.

19. The method of claim 16, wherein the first and second dielectric layers include silicon nitride.

20. The method of claim 16, wherein the first and second electrodes include tantalum nitride.

* * * * *